United States Patent
Yoo

(10) Patent No.: US 9,160,948 B2
(45) Date of Patent: Oct. 13, 2015

(54) REPLICA NOISE GENERATOR USING PIXEL MODELING AND RAMP SIGNAL GENERATOR INCLUDING THE SAME

(71) Applicant: SK hynix Inc., Gyeonggi-do (KR)

(72) Inventor: Si-Wook Yoo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/496,971

(22) Filed: Sep. 25, 2014

(65) Prior Publication Data
US 2015/0264281 A1    Sep. 17, 2015

(30) Foreign Application Priority Data
Mar. 17, 2014   (KR) .......................... 10-2014-0030907

(51) Int. Cl.
| | |
|---|---|
| H03K 4/90 | (2006.01) |
| H04N 5/359 | (2011.01) |
| H03K 3/84 | (2006.01) |
| H03K 4/502 | (2006.01) |
| H03K 4/56 | (2006.01) |

(52) U.S. Cl.
CPC .............. *H04N 5/3597* (2013.01); *H03K 3/84* (2013.01); *H03K 4/502* (2013.01); *H03K 4/56* (2013.01)

(58) Field of Classification Search
None
See application file for complete search history.

(56) References Cited

U.S. PATENT DOCUMENTS

| | | | | |
|---|---|---|---|---|
| 6,313,819 | B1* | 11/2001 | Maekawa et al. | 345/92 |
| 2005/0057389 | A1* | 3/2005 | Krymski | 341/169 |
| 2007/0052055 | A1* | 3/2007 | McKee | 257/462 |
| 2013/0258148 | A1* | 10/2013 | Kobayashi et al. | 348/294 |
| 2014/0301133 | A1* | 10/2014 | Imura et al. | 365/149 |

* cited by examiner

*Primary Examiner* — Cassandra Cox
(74) *Attorney, Agent, or Firm* — IP & T Group LLP

(57) ABSTRACT

A replica noise generator includes a control logic unit suitable for outputting a capacitance adjusting signal; a replica noise generation unit suitable for generating a replica noise through a coupling of a power voltage used in a pixel array by adjusting a capacitance value in response to the capacitance adjusting signal; and a source follower suitable for inputting the generated replica noise.

16 Claims, 3 Drawing Sheets

REPLICA NOISE GENERATOR USING PIXEL MODELING AND RAMP SIGNAL GENERATOR INCLUDING THE SAME

CROSS-REFERENCE TO RELATED APPLICATIONS

The present application claims priority of Korean Patent Application No. 10-2014-0030907, filed on Mar. 17, 2014, which is incorporated herein by reference in its entirety.

BACKGROUND

1. Field

Various embodiments of the present invention relate to a noise cancellation in a complementary metal oxide semiconductor (CMOS) image sensor and, more particularly, to a replica noise generator for generating a replica noise that copies pixel power noise, and a ramp signal generator including the same.

2. Description of the Related Art

In the general column parallel structure of a CMOS image sensor, noise may be caused by the power supply voltage of a comparator, which operates in differential mode, and the noise may be effectively removed through operations in a common mode.

However, since power noise generated from pixels may be contained in the pixel signal and then applied to the readout circuit, the power noise may remain in the pixel data and affect image sensor performance.

The pixel power noise may include power supply noise or ground noise that overlap within a specific circuit. Additionally, the pixel power noise may include various other noises generated in the pixels.

Since the power noise of the pixels may cause horizontal noise in CMOS image sensors, the pixel power noise needs to be suppressed as much as possible.

Thus, it is suggested that the power noise of the pixel be differentially removed from the viewpoint of the comparator by overlapping the power noise of the pixels with the ramp signal, using a voltage overlapping function.

A replica noise generator that generates replica noise, by copying pixel power noise, may be a useful solution to this concern. By copying the pixel power noise and applying it to the ramp signal, the pixel power noise may be removed resulting in improved pixel data.

SUMMARY

Various embodiments of the present invention are directed to a replica noise generator that copies power noise of the pixels using pixel modeling and a ramp signal generator including the same.

In accordance with an embodiment of the present invention, a replica noise generator may include a control logic unit suitable for outputting a capacitance adjusting signal; a replica noise generation unit suitable for generating a replica noise through a coupling of a power voltage used in a pixel array by adjusting a capacitance value in response to the capacitance adjusting signal; and a source follower suitable for inputting the generated replica noise.

In accordance with an embodiment of the present invention, a ramp signal generator may include a ramp signal generation unit suitable for generating a ramp signal and a gain amplification control signal; a replica noise generator suitable for generating a replica noise; and a voltage overlapping unit suitable for controlling a voltage gain by amplifying the ramp signal according to the gain amplification control signal, and overlapping the replica noise with the ramp signal. The replica noise generator may includes a control logic unit suitable for outputting a capacitance adjusting signal; a replica noise generation unit suitable for generating the replica noise through a coupling of a power voltage used in a pixel array by adjusting a capacitance value in response to the capacitance adjusting signal; and a source follower suitable for inputting the replica noise.

DETAILED DESCRIPTION

Figure 1:
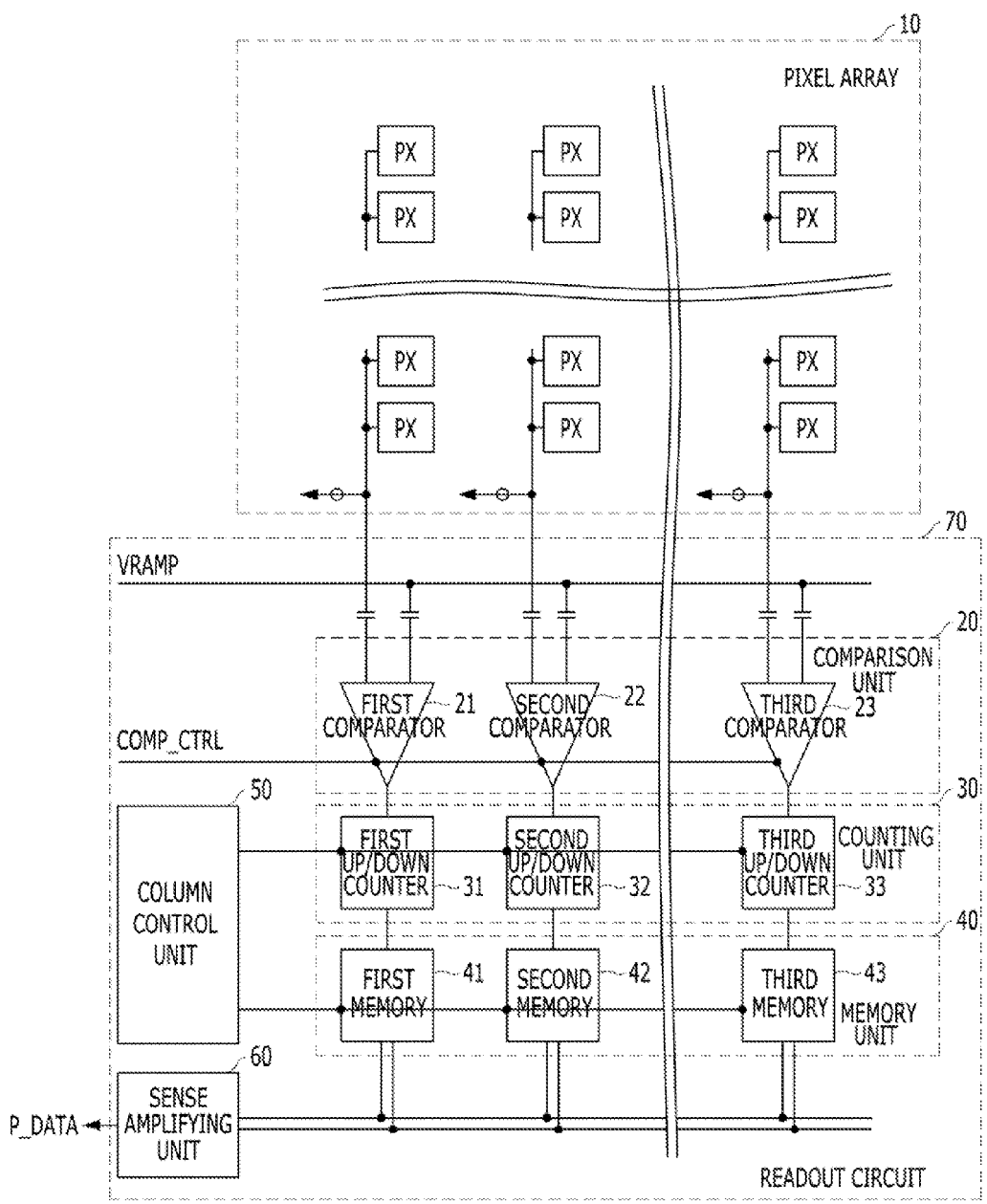
FIG. 1 is a block diagram illustrating a CMOS image sensor having a column parallel structure.

Exemplary embodiments of the present invention will be described below in more detail with reference to the accompanying drawings. The present invention may be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and, in some instances, proportions may have been exaggerated in order to clearly illustrate features of the embodiments. In this specification, specific terms have been used. The terms are used to describe the present invention, and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form, and vice versa, as long as it is not specifically mentioned. Furthermore, 'include/comprise' or 'including/comprising' used in the specification represents that one or more components, steps, operations, and elements exists or are added.

FIG. 1 is a block diagram illustrating a CMOS image sensor having a column parallel structure.

Referring to FIG. 1, the CMOS image sensor may include a pixel array 10 and a readout circuit 70. The readout circuit 70 may include a comparison unit 20, a counting unit 30, a memory unit 40, a column control unit 50 and a sense amplifying unit 60.

The pixel array 10 outputs a pixel signal corresponding to incident light. The comparison unit 20 compares a value of a pixel signal outputted from the pixel array 10 with a value of a ramp signal VRAMP applied from a voltage generation unit (not shown) in response to a comparator control signal COMP_CTRL transferred from a CMOS image sensor controller (not shown).

The counting unit 30 counts an output signal outputted from the comparison unit 20. The memory unit 40 stores counting information received from the counting unit 30.

The column control unit 50 controls an operation of the counting unit 30 and the memory unit 40. The sense amplifying unit 60 amplifies a signal corresponding to data stored in and outputted from the memory unit and outputs pixel data P_DATA.

Herein, the comparison unit 20 includes a first comparator 21, a second comparator 22 and a third comparator 23. The counting unit 30 includes a first up/down counter 31, a second up/down counter 32 and a third up/down counter 33. The memory unit 40 includes a first memory 41, a second memory 42 and a third memory 43. In another embodiment of the present invention, another memory may be used as the first, second and third up/down counters 31, 32 and 33.

An operation (i.e., an analog-to-digital conversion operation) performed by the first comparator 21, the first up/down counter 31 and the first memory 41 will be exemplarily explained as below.

The first comparator 21 receives a pixel signal outputted from a first column pixel of the pixel array 10 through a first terminal, and a ramp signal VRAMP generated from a voltage generation unit (not shown) through a second terminal, and compares a value of the pixel signal with a value of the ramp signal VRAMP in response to a comparator control signal COMP_CTRL transferred from a CMOS image sensor controller.

Since a voltage of the ramp signal VRAMP gradually decreases as time elapses, the value of the pixel signal become same as the value of the ramp signal VRAMP. An output value of the first comparator 21 is inverted when the value of the pixel signal becomes same as the value of the ramp signal VRAMP.

The first up/down counter 31 counts until the output of the first comparator 21 is inverted.

The first memory 41 stores the value (i.e., the counting information) counted in the first up/down counter 31, and outputs the stored counting information.

As described above, a column parallel structure includes' an analog-to-digital converter in each column. The column parallel structure compares the value of the pixel signal outputted from the pixel with the value of the ramp signal VRAMP in response to the comparator control signal COMP_CTRL, and outputs the counting information.

Herein, by using a common mode, each of the first, second and third comparators 21, 22 and 23 may efficiently remove noise, which is caused by the power supply voltage of the comparators operating in a differential mode.

However, since the power noise generated from the pixel may be included in the pixel signal and is applied to the readout circuit 70, the power noise may not be removed through the readout circuit and may be outputted in the pixel data P_data.

The power noise of the pixel needs to be removed or suppressed as much as possible since the power noise of the pixel may cause horizontal noise in the CMOS image sensor. This pixel power noise may be differentially removed from the perspective of the comparator input by overlapping replica power noise having a shape or amplitude similar to or identical to a power noise of the pixel (i.e., copying the power noise of the pixel) with a ramp signal through a voltage overlapping function. This will be described with reference to FIG. 2 as below.

Figure 2:
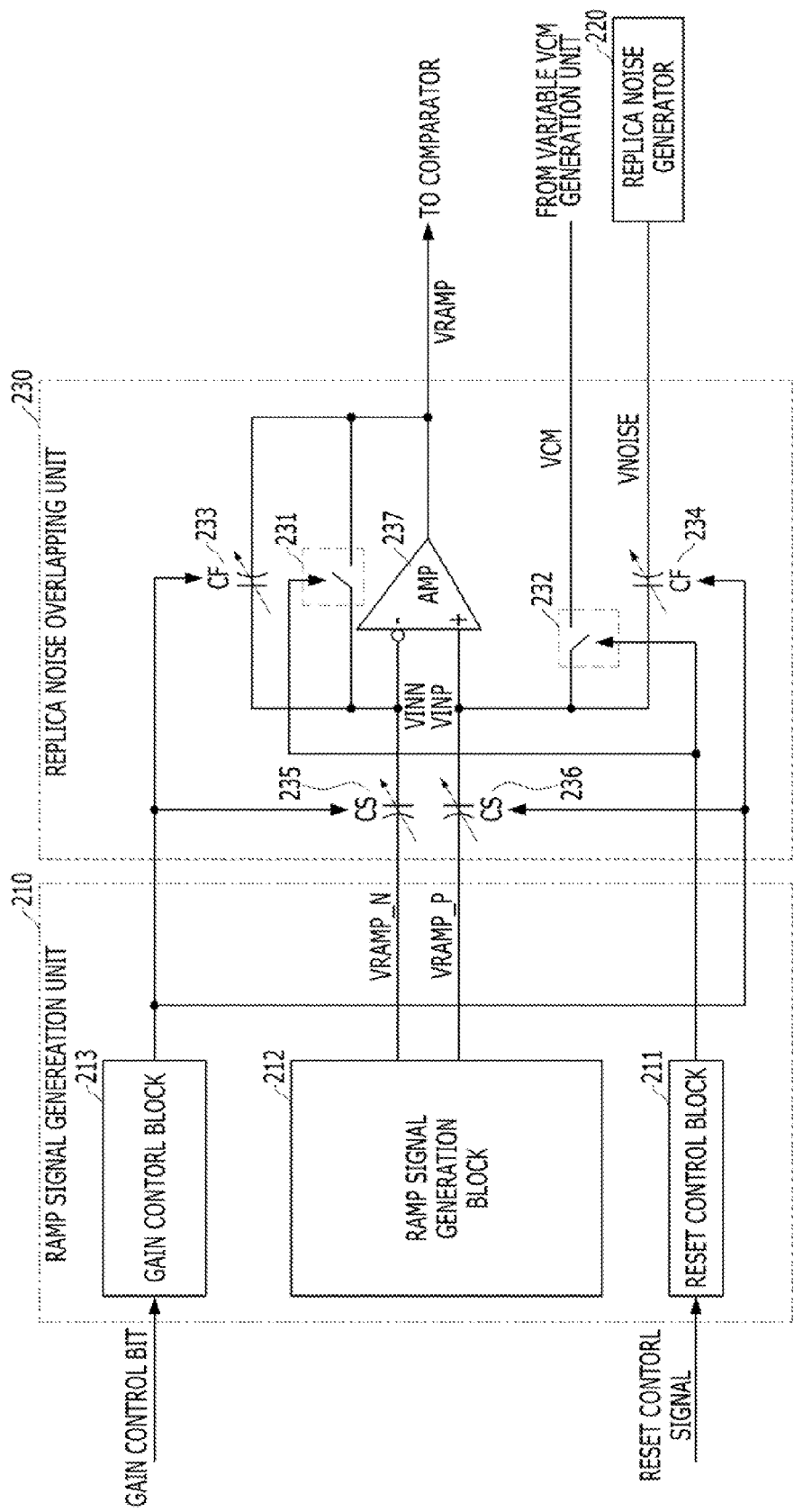
FIG. 2 is a block diagram illustrating a ramp signal generator in accordance with an embodiment of the present invention.

FIG. 2 is a block diagram illustrating a ramp signal generator in accordance with an embodiment of the present invention.

Referring to FIG. 2, the ramp signal generator may include a ramp signal generation unit 210, a replica noise generator 220 and a replica noise overlapping unit 230.

The ramp signal generation unit 210 generates a ramp signal and a gain amplifying control signal. The ramp signal generation unit 210 may include a reset control block 211, a ramp signal generation block 212 and a gain control block 213.

The reset control block 211 outputs a switch control signal to the replica noise overlapping unit 230 in response to a reset control signal outputted from a control unit (not shown). More specifically, the reset control block 211 generates the switch control signal for switching a reset switch 231 and an initializing switch 232 of the replica noise overlapping unit 230, and controls the reset switch 231 and the initializing switch 232 of the replica noise overlapping unit 230 in response to the reset control signal. Herein, the reset control signal outputted from the control unit (not shown) may be a reset control timing signal, and is activated once as a pulse before a readout operation is performed at each row of the CMOS image sensor. The control unit (not shown) may be a digital core block.

The ramp signal generation block 212 generates a ramp signal and applies the ramp signal to the replica noise overlapping unit 230. More specifically, the ramp signal generation block 212 generates ramp signals VRAMP_N and VRAMP_P and provides the ramp signals VRAMP_N and VRAMP_P to a first terminal (e.g., a negative terminal) and a second terminal (e.g., a positive terminal) of a differential amplifier 237 of the replica noise overlapping unit 230, respectively. The ramp signal generation block 212 may be implemented as a current steering digital-to-analog converter (DAC). Herein, a gain control function is implemented by the replica noise overlapping unit 230. Thus, the current steering DAC does not perform the gain control function.

The gain control block 213 outputs a capacitor control signal to the replica noise overlapping unit 230 in response to a gain control bit transferred from the control unit (not shown). More specifically, the gain control block 213 generates the capacitor control signal for adjusting a sampling capacitor value CS (i.e., a capacitance of a sampling capacitor) and a feedback capacitor value CF (i.e., a capacitance of a feedback capacitor) of the replica noise overlapping unit 230 and outputs the capacitor control signal to a first feedback capacitor 233, a second feedback capacitor 234, a first sampling capacitor 235 and a second sampling capacitor 236 included in the replica noise overlapping unit 230.

Herein, the gain control bit having a value of "0" or "1" is received from the control unit included in a CMOS image sensor chip. Thus, the gain control block 213 generates the capacitor control signal for increasing or decreasing the feedback capacitor value (CF) and the sampling capacitor value (CS), and outputs the capacitor control signal to the first feedback capacitor 233, the second feedback capacitor 234, the first sampling capacitor 235 and the second sampling capacitor 236 in response to the gain control bit. Thus, a voltage amplified gain is increased or decreased linearly as described in equation 1, below.

The gain control for the replica noise overlapping unit 230 is preset before a frame of the CMOS image sensor operates. That is, a voltage amplified gain is not changed when the replica noise overlapping unit 230 operates. Thus, the digital core block of the CMOS image sensor determines the voltage amplified gain according to the brightness of surrounding environment.

Next, a variable common mode voltage generation unit generates a common mode voltage (VCM) according to a VCM level control bit and applies the generated common mode voltage (VCM) to a differential amplifier 237 through an initializing switch 232 of the replica noise overlapping unit

230. Herein, the VCM level control bit having a value of "0" or "1 is received from the control unit (not shown) included in the CMOS image sensor chip. That is, the variable VCM generation unit increases or decreases a voltage level of the common mode voltage VCM variably according to the VCM level control bit, and applies the common mode voltage VCM to the second terminal (e.g., a positive terminal) of the differential amplifier 237 through the initializing switch 232. The common mode voltage VCM is increased or decreased linearly according to the VCM level control bit.

The replica noise generator 220 generates the replica noise VNOISE to be overlapped with the ramp signal and outputs the replica noise VNOISE to the replica noise overlapping unit 230.

The pixel power noise is one of the horizontal noises in CMOS image sensors and may include supply noise, ground noise, or overlapping supply and ground noise.

In order to remove the pixel power noise, the replica noise generator 220 needs to generate replica noise VNOISE, a copy of the pixel power noise.

The replica noise overlapping unit 230 overlaps the replica noise VNOISE with the ramp signal generated from the ramp signal generation unit 210. More specifically, the replica noise overlapping unit 230 adjusts a voltage gain by amplifying the ramp signal generated from the ramp signal generation unit 210 at a ratio of the capacitor values, which is adjusted according to a gain amplifying control signal, and overlaps the replica noise VNOISE with the ramp signal generated from the ramp signal generation unit 210. The replica noise overlapping unit 230 may be implemented using a voltage buffer or a programmable gain amplifier (PGA).

The replica noise overlapping unit 230 includes a switching unit, a feedback capacitor unit, a sampling capacitor unit, and a differential amplifier 237.

The switching unit having a reset switch 231 and an initializing switch 232 initializes the differential amplifier 237 with the common mode voltage generated from the variable VCM generation unit in response to the switch control signal generated from the reset control block 211.

The reset switch 231 is disposed between a first terminal of the differential amplifier 237 and an output terminal thereof. The initializing switch 232 is disposed between a second terminal of the differential amplifier 237 and the variable VCM generation unit. The reset switch 231 and the initializing switch 232 are closed if the switch control signal of the reset control block 211 is in an on-state. Thus, a closed loop feedback network is formed in the replica noise overlapping unit 230. A first input node VINN, a second input node VINP and an output node VRAMP of the differential amplifier 237 have a voltage level that is the same as a voltage level of the common mode voltage VCM through the second terminal of the differential amplifier 237. Operating points of the input nodes and the output node of differential amplifier 237 are determined and initialized to the voltage level of the common mode voltage since the differential amplifier 237 has a proper potential to perform a normal operation. Herein, a malfunction of the differential amplifier 237, which is caused by an improper operation point due to a fixed common mode voltage, is prevented by using the variable common mode voltage VCM.

The feedback capacitor having a first feedback capacitor 233 and a second feedback capacitor 234 adjusts the feedback capacitor value (CF) in response to the capacitor control signal generated from the gain control block 213.

The first feedback capacitor 233 is disposed between the first terminal of the differential amplifier 237 and the output terminal thereof. The second feedback capacitor 234 is disposed between the second terminal of the differential amplifier 237 and the output terminal thereof. The value of the first feedback capacitor 233 and the second feedback capacitor 234 is adjusted in response to the capacitor control signal. Herein, the first feedback capacitor 233 and the second feedback capacitor 234 may be implemented by a combination of capacitors and switches (not shown), and the capacitors may be used according to a state of the switches.

The sampling capacitor unit having the first sampling capacitor 235 and the second sampling capacitor 236 samples the ramp signal generated from the ramp signal generation block 212.

The first sampling capacitor 235 is disposed between an output terminal of the ramp signal generation block 212 and the first terminal of the differential amplifier 237. The second sampling capacitor 236 is disposed between the output terminal of the ramp signal generation block 212 and the second terminal of the differential amplifier 237. The value of the first sampling capacitor 235 and the second sampling capacitor 236 are adjusted in response to the capacitor control signal. In another embodiment, the first sampling capacitor 235 and the second sampling capacitor 236 may have a fixed capacitor value.

The differential amplifier 237 amplifies and outputs the ramp signal sampled from the sampling capacitor unit based on a ratio of the value of the sampling capacitor unit and the value of the feedback capacitor unit.

The differential amplifier 237 is an inversion type differential amplifier for inverting and receiving an input through the first terminal (e.g., a negative terminal). The differential amplifier 237 is initialized to the voltage level of the common mode voltage received through the second terminal (e.g., a positive terminal) when the reset switch 231 and the initializing switch 232 are switched on. Then, if the ramp signal sampled from the first sampling capacitor 235 and the second sampling capacitor 236 is inputted through the first terminal and the second terminal of the differential amplifier 237, the ramp signal is amplified and outputted according to a ratio of the value of the first and second sampling capacitors 235 and 236 and the value of the first and second feedback capacitors 233 and 234.

Thus, a voltage amplified gain Gv is determined according to the ratio of the value of the first and second sampling capacitors (CS) and the value of the first and second feedback capacitors (CF).

$$Gv=CS/CF \qquad \text{[Equation 1]}$$

Subsequently, if the replica noise VNOISE generated from the replica noise generator 220 is applied to the second terminal of the differential amplifier 237 through the second feedback capacitor 234, the replica noise VNOISE is divided to have "CF/(CS+CF)", and is applied to the second terminal of the differential amplifier 237. One of the first and second terminals of the differential amplifier 237 has the same value as the divided replica noise. Thus, the output of the differential amplifier 237 may have a voltage variation having an amplitude that is the same as the voltage level of the power noise VNOISE, and is overlapped with the ramp voltage outputted from the differential amplifier 237. That is, a total output of the differential amplifier is expressed as "2×(CS+CF)×VRAMP+VNOISE".

That is, as described above, if the replica noise is applied, an alternating current (AC) element of the replica noise is transferred to the output terminal of the differential amplifier 237.

More specifically, replica noise VNOISE is divided to have "CF/(CS+CF)", and is applied to the second terminal of the differential amplifier 237 through the first input node VINN. Herein, a charge variation amount (referring to equation 2) caused by the replica noise is transferred to the first terminal of the differential amplifier 237 through the second input node VINP since the replica noise overlapping unit 230 is a negative feedback circuit.

'charge variation amount in each of VINN node and VINP node caused by replica noise'=[CF/(CS+CF)]*VNOISE*(CS+CF)=CF*VNOISE [Equation 2]

Herein, the charge, which is varied on the first terminal of the differential amplifier 237, is transferred to the first feedback capacitor 233, and a voltage having same amplitude as the replica noise VNOISE is formed on the output terminal of the different amplifier 237.

That is, "the charge amount transferred to the output terminal of the different amplifier 237 is CF×VNOISE". Thus, an output voltage of the differential amplifier 237 is expressed as below with reference to the equation "charge amount (Q)=capacitance (C)×voltage (V).

'output voltage of the differential amplifier caused by the power noise'=CF×(VNOISE/CF)=VNOISE [Equation 3]

Figure 3:
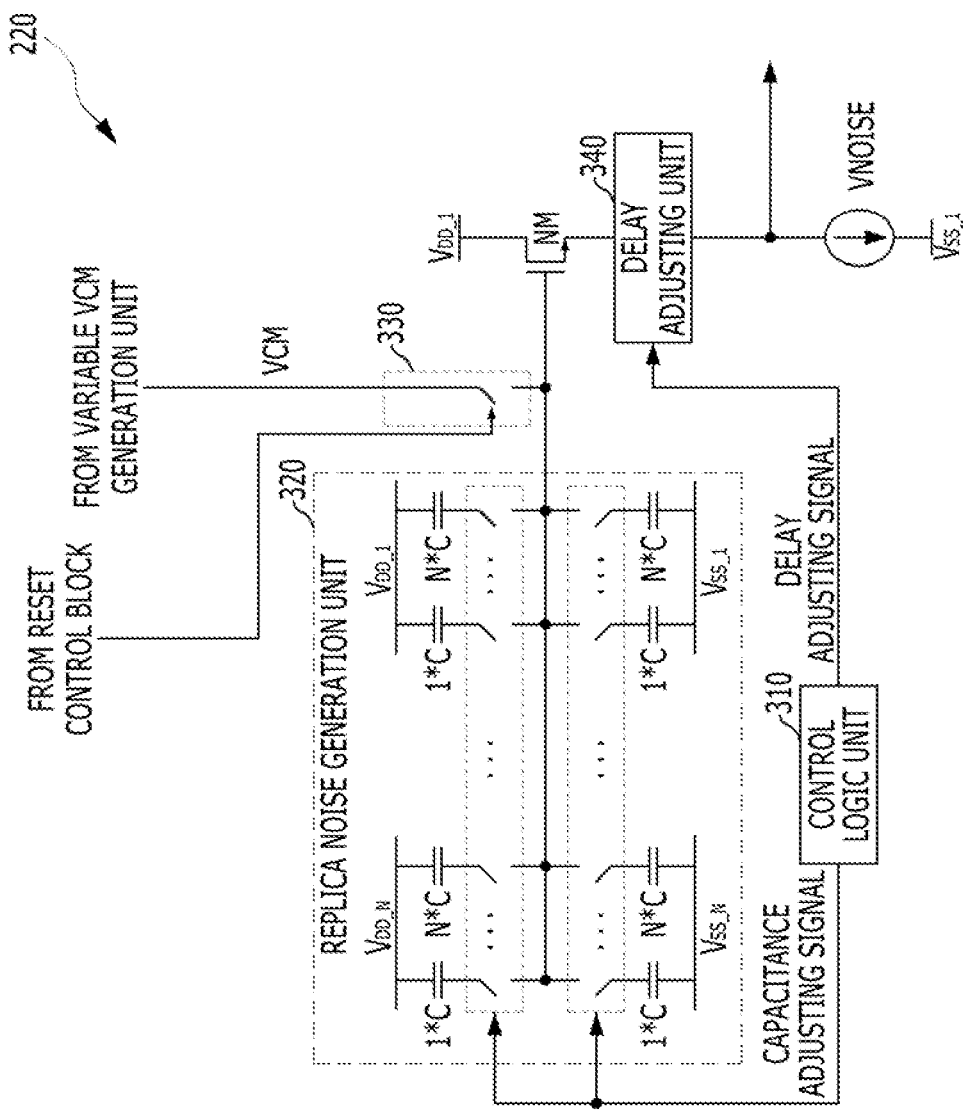
FIG. 3 is a detailed diagram of a replica noise generator shown in FIG. 2.

That is, the replica noise VNOISE is transferred as the output of the differential amplifier 237 irrespective of a gain of the replica noise overlapping unit 230, FIG. 3 is a detailed diagram of the replica noise generator 220 shown in FIG. 2. The replica noise VNOISE may be generated by modeling a pixel to compensate for the power noise of the pixel.

Herein, a replica noise generator 220 may implement the replica noise VNOISE as an output of a source follower using pixel modeling.

Referring to FIG. 3, the replica noise generator 220 may include a control logic unit 310, a replica noise generation unit 320, an operation point adjusting unit 330 and a delay adjusting unit 340.

The control logic unit 310 generates a capacitance adjusting signal for adjusting a capacitance of the replica noise generation unit 320 and a delay adjusting signal for adjusting a delay of the replica noise.

More specifically, the control logic unit 310 outputs the capacitance adjusting signal for adjusting the capacitance of a capacitor array, which is included in the replica noise generation unit 320, to the replica noise generation unit 320, and outputs the delay adjusting signal for adjusting the delay of the replica noise, received through a source follower, to the delay adjusting unit 340. The capacitance adjusting signal and the delay adjusting signal are preset through a measuring manner. That is, the capacitance adjusting signal and the delay adjusting signal may have the values determined through a measuring manner.

The replica noise generation unit 320 is modeled to a floating diffusion node using the capacitor array and a switch array therein, adjusts a capacitance value in response to the capacitance adjusting signal, and generates the replica noise by coupling various power voltages VDD_1 to VDD_N used in the pixel array.

The capacitance value of the capacitor array 1*C to N*C is adjusted when the corresponding switches in the switch array are switched on or off in response to the capacitance adjusting signal outputted from the control logic unit 310. Thus, the replica noise is generated through the coupling of various power voltages VDD_1 to VDD_N used in the pixel array, and is outputted to a source follower. Since the floating diffusion node of the pixel has an influence on the power noise, the floating diffusion node is modeled.

The operation point adjusting unit 330 adjusts an operation point of the source follower. The source follower may include an NMOS transistor NM, or the source follower may include an NMOS transistor NM and a current source.

More specifically, the operation point adjusting unit 330 may include a switch, and adjust the operation point of the source follower by switching on or off the common mode voltage outputted from the variable VCM generation unit in response to the switch control signal outputted from the reset control block 211. That is, the operation point adjusting unit 330 sets the operation point (e.g., potential) of an input terminal of the source follower to the common mode voltage such that the source follower performs a normal operation. When the operation point adjusting unit 330 starts an initial operation in response to the switch control signal outputted from the reset control block 11, the switch is switched on and the common mode voltage is provided. If the switch is turned off, the input node of the source follower is charged and sampled by the common mode voltage. If the input node of the source follower has proper potential and is in a floating state, the replica noise VNOISE may be inputted through the input node of the source follower.

The delay adjusting unit 340 is modeled with an output line of the source follower, and adjusts and outputs the delay of the replica noise in response to the delay adjusting signal outputted from the control logic unit 310.

More specifically, the delay adjusting unit 340 adjusts a delay, for example, corresponding to a transmission length of the source follower, of the replica noise outputted from the replica noise generation unit 320 in response to the delay adjusting signal, and outputs the replica noise VNOISE. Since the replica noise outputted from the replica noise generation unit 320 may be delayed by an input terminal transconductance and an output load of the source follower, the output line of the source follower is modeled. It is preferable that the modeling of the source follower uses a power similar to the pixel output line used in the pixel array.

As described above, a replica noise generator in accordance with an embodiment of the present invention may mix and output various replica noises related to various power voltages VDD_1 to VDD_N used in the pixel array, using the pixel modeling.

Moreover, a replica noise generator in accordance with an embodiment of the present invention may be applied to various devices for mixing and generating replica noise.

Meanwhile, the power noise of the pixel may be added to a direct current (DC) voltage. Herein, the power noise of the pixel may be an alternating current (AC) voltage and be applied to a floating diffusion node of the pixel.

While the present invention has been described with respect to the specific embodiments, it will be apparent to those skilled in the art that various changes and modifications may be made without departing from the spirit and scope of the invention as defined in the following claims.

What is claimed:

1. A replica noise generator, comprising:
    a control logic unit suitable for outputting a capacitance adjusting signal;
    a replica noise generation unit suitable for generating a replica noise through a coupling of a power voltage used in a pixel array by adjusting a capacitance value in response to the capacitance adjusting signal; and
    a source follower suitable for inputting the generated replica noise,
    wherein the replica noise generation unit is modeled with a floating diffusion node of the pixel array.

2. The replica noise generator of claim 1, further comprising an operation point adjusting unit suitable for adjusting an operation point of the source follower.

3. The replica noise generator of claim 1, further comprising a delay adjusting unit suitable for adjusting a delay of the replica noise in response to a delay adjusting signal generated from the control logic unit.

4. The replica noise generator of claim 2, wherein the replica noise generation unit is modeled with the floating diffusion node of the pixel array using a capacitor array and a switch array included in the replica noise generation unit.

5. The replica noise generator of claim 2, wherein the operation point adjusting unit sets an operation point of the source follower by switching on or off a common mode voltage in response to a switch control signal.

6. The replica noise generator of claim 3, wherein the delay adjusting unit performs a modeling function for modeling an output voltage using a pixel output power line used in the pixel array.

7. The replica noise generator of claim 1, wherein the replica noise generator adds the power noise of the pixel array to a predetermined direct current (DC) voltage.

8. A ramp signal generator comprising:
a ramp signal generation unit suitable for generating a ramp signal and a gain amplification control signal;
a replica noise generator suitable for generating a replica noise; and
a voltage overlapping unit suitable for controlling a voltage gain by amplifying the ramp signal according to the gain amplification control signal, and overlapping the replica noise with the ramp signal,
wherein the replica noise generator includes:
a control logic unit suitable for outputting a capacitance adjusting signal;
a replica noise generation unit suitable for generating the replica noise through a coupling of a power voltage used in a pixel array by adjusting a capacitance value in response to the capacitance adjusting signal; and
a source follower suitable for inputting the replica noise.

9. The ramp signal generator of claim 8, further comprising an operation point adjusting unit suitable for adjusting an operation point of the source follower.

10. The ramp signal generator of claim 8, further comprising a delay adjusting unit suitable for adjusting a delay of the replica noise in response to a delay adjusting signal generated from the control logic unit.

11. A replica noise generator, comprising:
a control logic unit suitable for outputting a capacitance adjusting signal;
a replica noise generation unit suitable for generating a replica noise through a coupling of a power voltage used in a pixel array by adjusting a capacitance value in response to the capacitance adjusting signal;
a source follower suitable for inputting a generated replica noise; and
a delay adjusting unit suitable for adjusting a delay of the replica noise in response to a delay adjusting signal generated from the control logic unit.

12. The replica noise generator of claim 11, further comprising an operation point adjusting unit suitable for adjusting an operation point of the source follower.

13. The replica noise generator of claim 12, wherein the replica noise generation unit is modeled with a floating diffusion node of the pixel array using a capacitor array and a switch array included in the replica noise generation unit.

14. The replica noise generator of claim 12, wherein the operation point adjusting unit sets an operation point of the source follower by switching on or off a common mode voltage in response to a switch control signal.

15. The replica noise generator of claim 11, wherein the delay adjusting unit performs a modeling function for modeling an output voltage using a pixel output power line used in the pixel array.

16. The replica noise generator of claim 11, wherein the replica noise generator adds the power noise of the pixel array to a predetermined direct current (DC) voltage.

* * * * *